US007508805B2

(12) United States Patent
Choi et al.

(10) Patent No.: US 7,508,805 B2
(45) Date of Patent: Mar. 24, 2009

(54) APPARATUS AND METHOD FOR DETECTING TRANSMITTING RATE OF TURBO DECODER

(75) Inventors: Soon-Jae Choi, Songnam-shi (KR);
Min-Goo Kim, Suwon-shi (KR);
Beong-Jo Kim, Songnam-shi (KR);
Young-Hwan Lee, Songnam-shi (KR);
Nam-Yul Yu, Seoul (KR); Sang-Hyuck Ha, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 383 days.

(21) Appl. No.: 10/398,369

(22) PCT Filed: Oct. 5, 2001

(86) PCT No.: PCT/KR01/01670
§ 371 (c)(1),
(2), (4) Date: Aug. 11, 2004

(87) PCT Pub. No.: WO02/29992
PCT Pub. Date: Apr. 11, 2002

(65) Prior Publication Data
US 2005/0053040 A1    Mar. 10, 2005

(51) Int. Cl.
H04B 7/216    (2006.01)
H03M 13/00    (2006.01)
H03M 13/03    (2006.01)
H04L 25/34    (2006.01)
H04L 25/49    (2006.01)

(52) U.S. Cl. .................. 370/342; 375/287; 714/758; 714/794; 714/786

(58) Field of Classification Search ........... 370/342; 375/225, 287; 714/758, 755, 794, 786
See application file for complete search history.

(56) References Cited

U.S. PATENT DOCUMENTS 6,182,261 B1 *  1/2001  Haller et al. ............. 714/758
6,526,531 B1 *  2/2003  Wang ..................... 714/704

FOREIGN PATENT DOCUMENTS

WO    WO 00/27037    5/2000

OTHER PUBLICATIONS

Yue C-W et al.; "On The FER Performance And Decoding Complexity Of Turbo Codes"; Vehicular Technology Conference; May 16-20, 1999, pp. 2214-2218.
Bauch g. et al.; "Iterative Equalization And Decoding In Mobile Communications Systems"; Sep. 30, 1997; pp. 307-312.
Zhai F. et al.; "New Error Detection Techniques and Stopping Criteria for Turbo Decoding"; Canadian Conference On Electrical And Computer Engineering; pp. 58-62.

* cited by examiner

*Primary Examiner*—George Eng
*Assistant Examiner*—Wesley L Kim
(74) *Attorney, Agent, or Firm*—Roylance, Abrams, Berdo & Goodman, LLP

(57) ABSTRACT

The present invention relates to an apparatus and method for detecting a data rate in a turbo decoder for a mobile communication system. When a rate selector selects one data rate among a plurality of data rates, a turbo decoder repeatedly decodes an input data frame within a predetermined repetition limit number using the selected data rate and outputs the decoded data. A CRC detector performs CRC check on the decoded data and outputs the CRC check result, and a decoding state measurer measures decoding quality depending on the decoded data and outputs decoding state information. A controller then sets the repetition limit number to a predetermined minimum value, controls the repetition limit number according to the decoding state information, controls the rate selector and determines a data rate of the input data depending on the CRC check result.

13 Claims, 8 Drawing Sheets

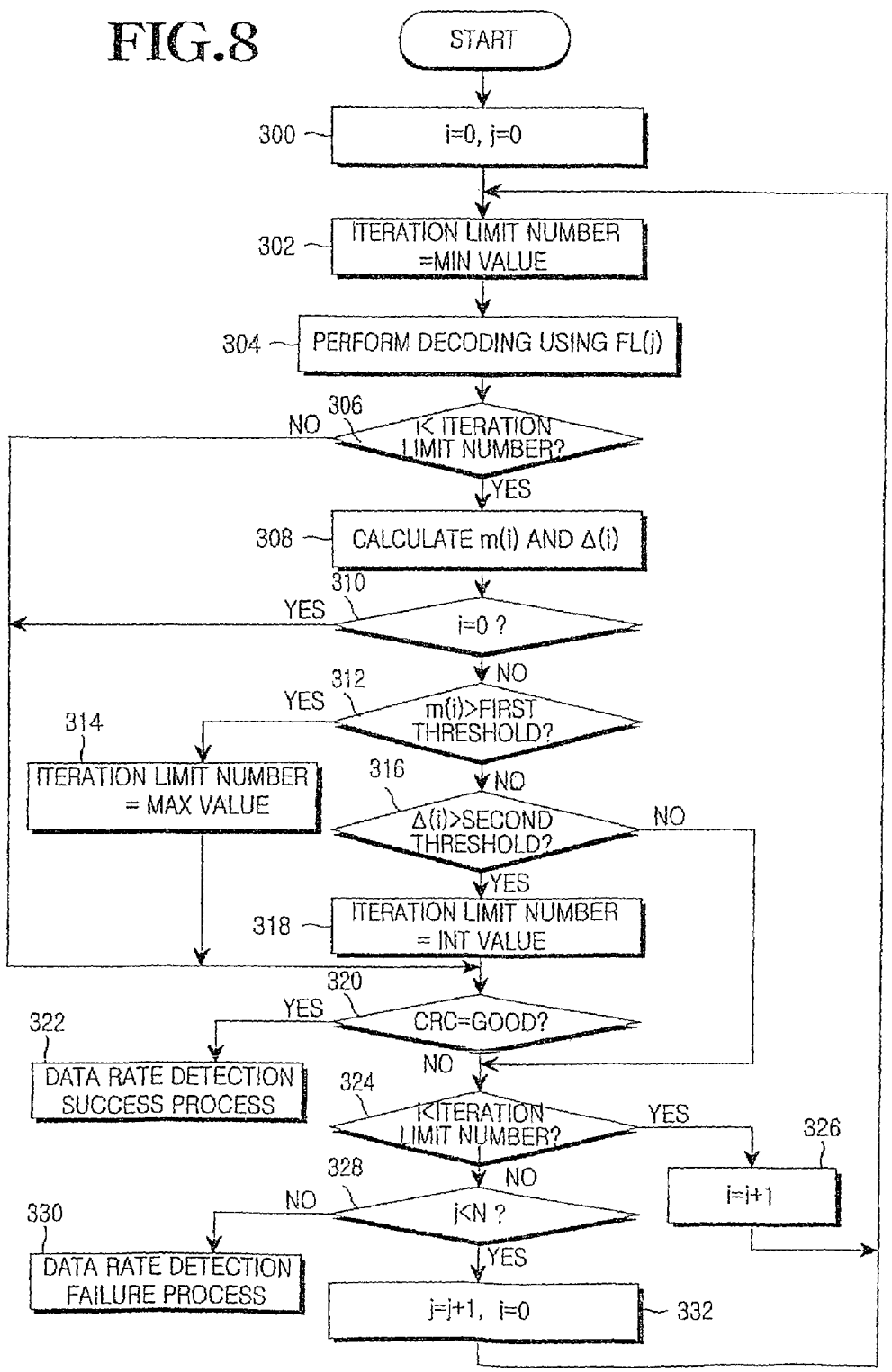

APPARATUS AND METHOD FOR DETECTING TRANSMITTING RATE OF TURBO DECODER

BACKGROUND OF THE INVENTION

1. Field of the Invention

The present invention relates generally to an apparatus and method for detecting a data rate, and in particular, to an apparatus and method for detecting a data rate of a turbo decoder in a mobile communication system.

2. Description of the Related Art

In general, an encoder and a decoder are used in a digital mobile communication system to correct an error of a forward channel. The digital mobile communication system transmits and receives data in a radio environment, so it employs a coding technique to prevent generation of noises in a transmission channel. The mobile communication system typically uses a turbo coding technique for the coding technique. 3GPP ($3^{rd}$ Generation Partnership Projection) or 3GPP2 ($3^{rd}$ Generation Partnership Projection 2), an ongoing standardization work on the mobile communication system, specifies that transmission data can be transmitted at different data rates. Here, the data rate depends upon a length (or size) of a frame decoded by a turbo decoder. For example, a data rate of 2.4 Kbps corresponds to a decoded frame length of 24 bits/frame, and a data rate of 4.8 Kbps corresponds to a decoded frame length of 48 bits/frame.

When transmitting data at various data rates, a transmitter generally transmits the data to a receiver along with information on a data rate of the currently transmitted data. However, transmitting the data along with the data rate of the transmission data causes a waste of transmission power, especially when the transmission data has a low data rate. Therefore, there is a demand for a method for transmitting data without information on its data rate.

There is a known blind rate detection (BRD) technique, in which a transmitter transmits data without information on its data rate and a receiver detects the data rate based on only the received data. When data is transmitted in the BRD mode after being subject to turbo encoding the results of CRC (Cyclic Redundancy Code) checking performed on an output of a turbo decoder are typically used to detect a data rate.

That is, the transmitter adds CRC information to transmission data before transmission. Then, a channel decoder of the receiver decodes the received data at all of its available data rates and determines whether the decoded data includes noises, through CRC checking. If it is determined through the CRC checking performed at a specific data rate that the frame is not damaged, the receiver detects the corresponding data rate. A procedure for detecting a data rate by the receiver using the CRC checking will be described in detail with reference to FIG. 1.

FIG. 1 illustrates a procedure for detecting a data rate by a receiver through CRC checking of the BRD technique in a mobile communication system according to the prior art. A detailed description of the conventional procedure for detecting a data rate will now be made with reference to FIG. 1.

In step 10, the receiver performing the turbo decoding receives frame data over a radio channel. In this procedure, a description of a radio processing process and a channel decoding process will not be provided. After receiving the frame data, the receiver sets count values i and j to '0', in step 12. Here, i represents a value for counting a decoding iteration number (or decoding frequency) to perform turbo decoding on one frame at a selected data rate. Further, j represents a value for counting the number of types of the data rates. That is, if the turbo decoding is iteratively performed 6 times, the i value represents a decoding iteration count value for limiting the turbo decoding to be performed up to 6 times, and if the number of the types of the data rates is 7, the j value represents a data rate type count value for performing the decoding at up to 7 data rates.

After the step 12, the receiver sets an iteration limit number to its maximum value in step 14. Here, the "iteration limit number" refers to the maximum number of iterative decoding at a specific data rate, i.e., a value for setting a threshold for the iteration count value 'i' of the turbo decoder. In step 16, the receiver performs turbo decoding at a data rate set to the j value. For example, if decoding on voice data is performed at 2 Kbps, 4 Kbps and 8 Kbps, then the receiver performs the decoding on the data with a frame length FL(j) associated with 2 Kbps or 8 Kbps, whichever determined first. That is, the receiver performs the decoding at one initial data rate.

After the decoding, the receiver analyzes the result of CRC checking performed on the decoded data in step 18. As the result of the analysis, if it is determined that the CRC is 'good', the receiver performs a data rate detection process for the current j value in step 20. Otherwise, the receiver determines whether the decoding iteration count value i is less than the iteration limit number, in order to iterate the decoding up to the iteration limit number. As the result of the determination, if the decoding iteration count value i is less than the iteration limit number, the receiver proceeds to step 24, and otherwise, proceeds to step 26. In the step 24, the receiver increases the decoding iteration count value i by 1, and then returns to the step 16. The reason for iteratively performing the decoding at one data rate will be described with reference to FIGS. 2 and 3.

FIG. 2 illustrates distribution of a decoding state value m(i) indicating the quality of a data frame when data with a frame size 60 transmitted over a radio channel is subject to iterative turbo decoding by a turbo decoder with a frame size 60. FIG. 3 illustrates distribution of an m(i) value when data with a frame size 40 transmitted over a radio channel is subject to iterative turbo decoding by a turbo decoder with a frame size 60.

In FIG. 2, a part represented by a solid line represents a part having an m(i) value of correctly decoded frame, while a part represented by dots represents an incorrectly decoded part. When performing the decoding for second time, the receiver iteratively performs the decoding for restoration, using the incorrectly decoded frames represented by the dots. Then, the incorrectly decoded frames are divided again into restored frames and non-restored frames, as shown in a second graph of FIG. 2. If the process is iterated several times, the frame data will be more correctly decoded, thus increasing a probability that the CRC will be detected in a 'good' state. However, in the case where the data is decoded with a frame length associated with another data rate, even though the decoding is performed several times, the decoding results will continuously show an error state as shown in FIG. 3.

Turning back to FIG. 1, the iterative limit number is typically set to 6. If the CRC is not 'good' after iterating the decoding six times at one data rate, the receiver determines in step 26 whether the data rate type count value j is larger than the number N of the data rates. As the result of the determination, if the data rate type count value j is not less than the number N, e.g., 3, of the data rates, the receiver proceeds to step 28 to perform a data rate detection failure process, considering that the decoding and the CRC checking have been completed for all of the available data rates. However, if the count value j indicates that the decoding has not yet performed at all of the data rates, i.e., if the j value is less than N, the receiver increases the count value j by 1 and sets the decoding iteration count value i to 0 in step 30, and then returns to the step 16 to repeat the steps 16 to 30.

However, the turbo decoding technique for detecting a data rate through the above process causes a waste of time in detecting the data rate, especially when there is a great difference between a data rate at which the data frame has been transmitted and the initial data rate at which the turbo decoding is performed. That is, for example, if it is assumed that the number of the data rates to be detected is N and the iteration number is 8, the decoding is performed (N−1)*8 times at the worst. In addition, an increase in the number of the data rates for the transmission data causes an increase in the detection time and also causes an increase in power consumption for detecting the data rate.

SUMMARY OF THE INVENTION

It is, therefore, an object of the present invention to provide an apparatus and method for controlling an iteration limit number for turbo decoding when detecting a data rate of a turbo-coded data in a BRD mode.

It is another object of the present invention to provide an apparatus and method for reducing a delay time and power consumption when detecting a data rate of turbo-coded data in a BRD mode.

According to one aspect of the present invention, A method for decoding coded data in one frame transmitted from a transmitter at one data rate of a plurality of data rates by a turbo decoder of a receiver having no information on a data rate at which the coded data is transmitted, and detecting a data rate of the coded data, comprising the steps of:

(a) decoding the coded data in the frame at a selected data rate of the plurality of the data rates by the turbo decoder and calculating a current decoding state value indicating an average of absolute values of log likelihood ratio (llr) values being identical to decoded values of the coded data, output from the turbo decoder;

(b) calculating a current under-decoding state value defined as a difference between the current decoding state value and a previous decoding state value;

(c) performing CRC (Cyclic Redundancy Check) checking on the decoded data, if the current decoding state value it larger than a first threshold or the current under-decoding state value is larger than a second threshold; and (d) determining the selected data rate as a data rate of the coded data transmitted from the transmitter, if the CRC checking result is good.

According to a second aspect of the present invention, a method for decoding coded data in one frame transmitted from a transmitter at one data rate of a plurality of data rates by a turbo decoder of a receiver having no information on a data rate at which the coded data is transmitted, and detecting a data rate of the coded data, comprising the steps of:

(a) decoding the data coded at a selected data rate of the plurality of the data rates and outputting decoded data;

(b) controlling an iteration limit number depending on decoding state information measured for the decoded data, if a number of decoding performed at the selected data rate is less than the iteration limit number;

(c) performing CRC checking on the decoded data, if the number of decoding is larger than or equal to the iteration limit number;

(d) determining the selected data rate as a data rate of the coded data transmitted from the transmitter, if the CRC checking result is good;

(e) repeating the steps (a) to (d) within the iteration limit number until the selected data rate is determined as the data of the coded data, if the CRC checking result is not good; and (f) repeating the steps (a) to (e) until another selected data rate of the plurality of the data rates is determined as the data rate of the coded data, if the selected data rate is not determined as the data rate of the coded data.

According to a third aspect of the present invention, an apparatus for decoding coded data in one frame transmitted from a transmitter at one data rate of a plurality of data rates by a turbo decoder of a receiver having no information on a data rate at which the coded data is transmitted, and detecting a data rate of the coded data, the apparatus comprising:

a data rate determiner for selecting a data rate from a plurality of data rates;

a turbo decoder for iteratively decoding an input data frame within an iteration limit number using the selected data rate, and outputting decoded data;

a CRC detector for performing CRC checking on the decoded data and outputting a CRC checking result;

a decoding state measurer for measuring decoding quality using the decoded data and outputting decoding state information; and a controller for first determining the iteration limit number as a minimum value, controlling the iteration limit number based on the decoding state information, controlling the data rate determiner, and determining a data rate of the input data based on the CRC checking result.

BRIEF DESCRIPTION OF THE DRAWINGS

The above and other objects, features and advantages of the present invention will become more apparent from the following detailed description when taken in conjunction with the accompanying drawings in which:

FIG. 8 illustrates a procedure for detecting a data rate in the BRD mode by a receiver performing turbo decoding according to a second embodiment of the present invention.

DETAILED DESCRIPTION OF THE PREFERRED EMBODIMENT

A preferred embodiment of the present invention will be described in detail herein below with reference to the accompanying drawings.

Figure 1:
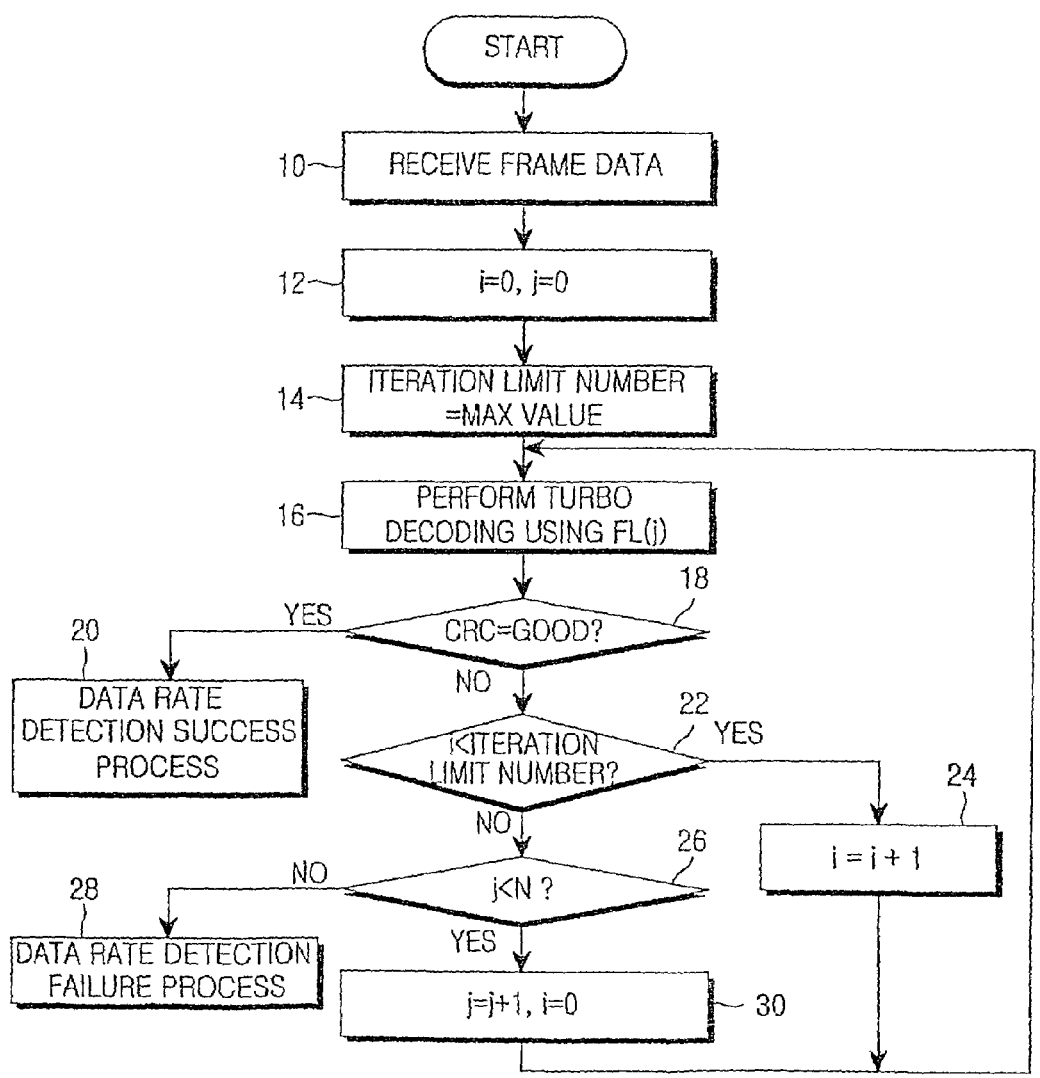
FIG. 1 illustrates a procedure for detecting a data rate by a receiver through CRC checking of a BRD technique in a mobile communication system according to the prior art.
Figure 2:
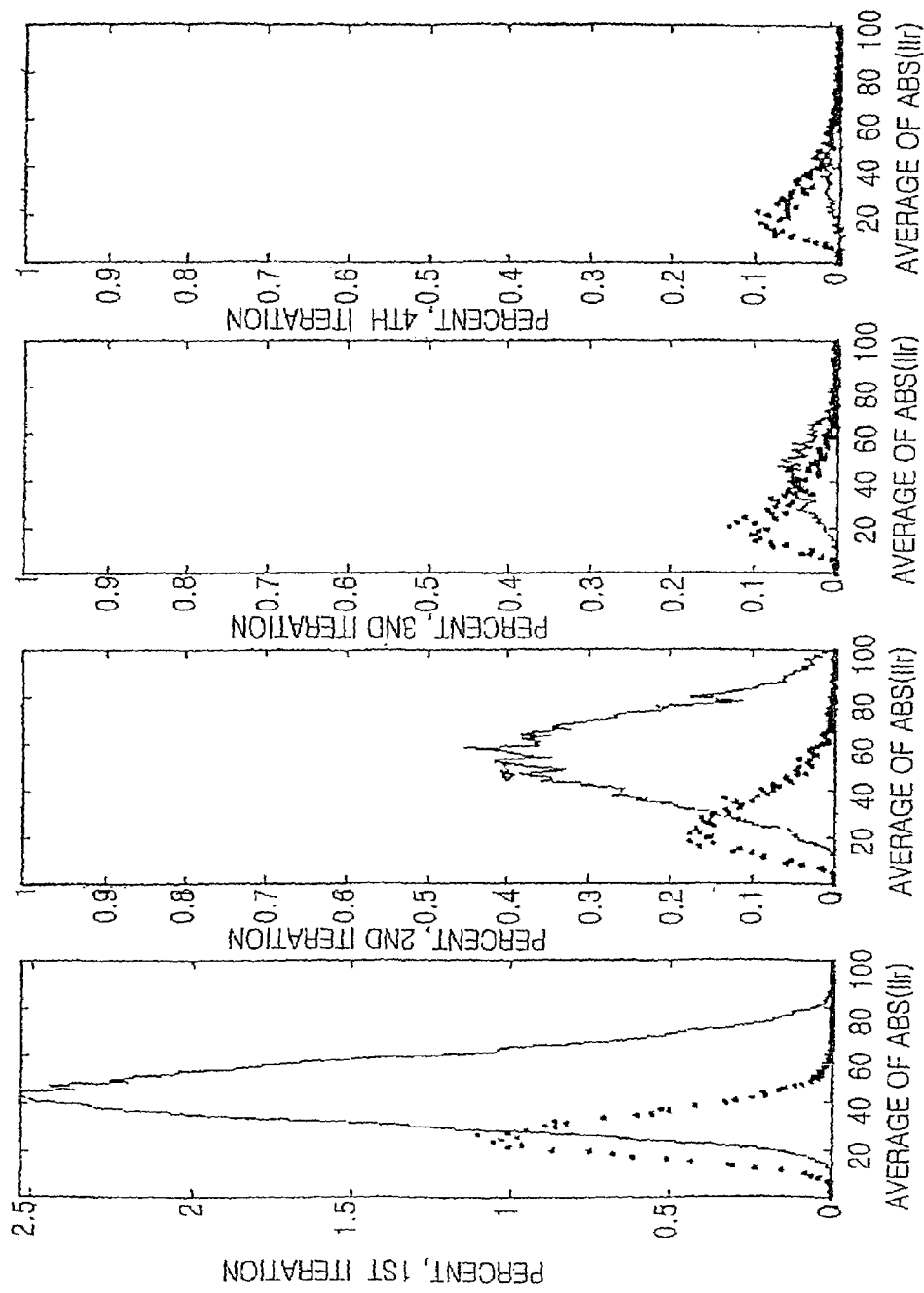
FIG. 2 illustrates a decoding state of data when data with a frame size 60 transmitted over a radio channel is subject to turbo decoding by a turbo decoder with a frame size 60.
Figure 3:
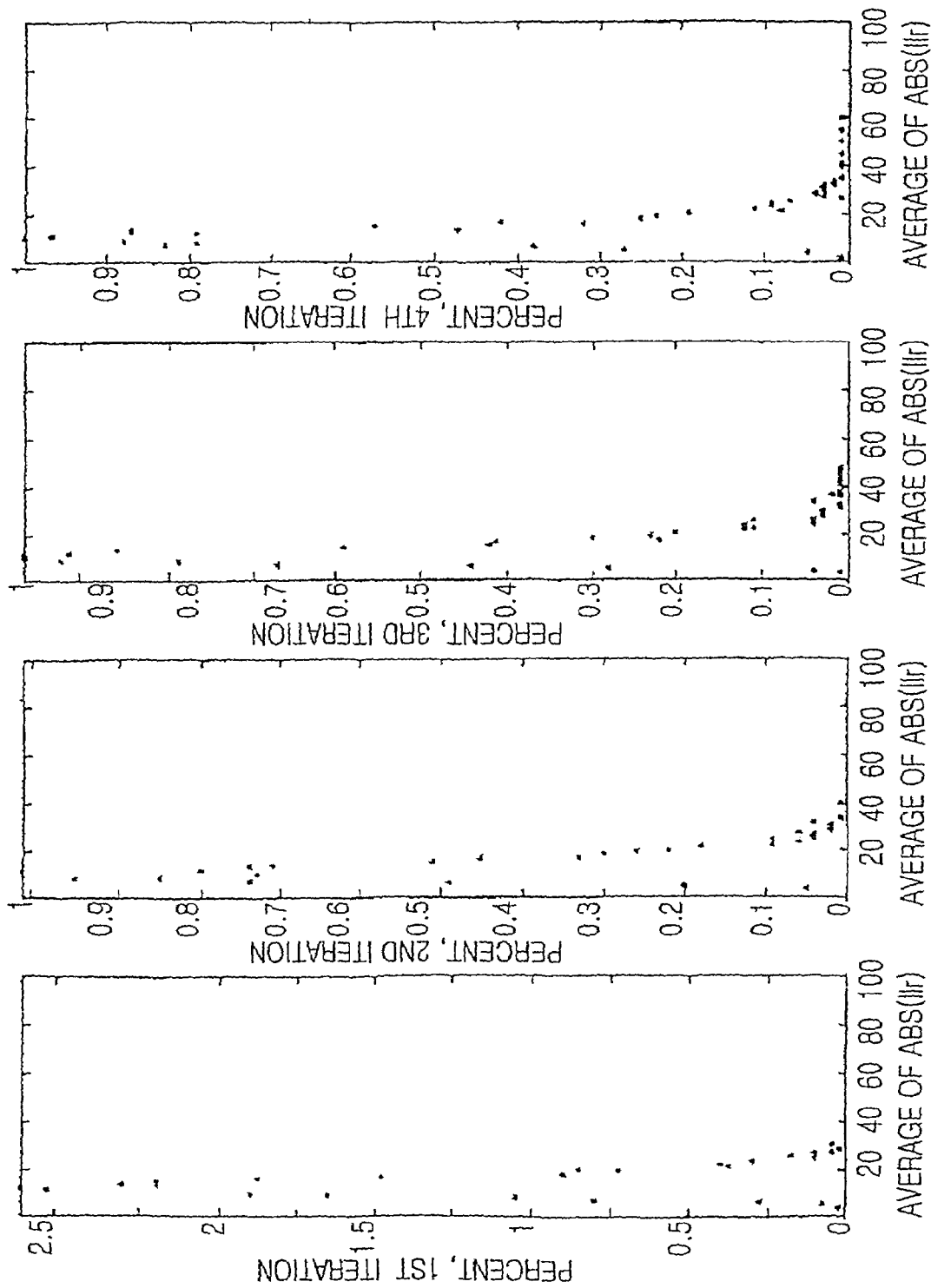
FIG. 3 illustrates a decoding state of data when data with a frame size 40 transmitted over a radio channel is subject to turbo decoding by a turbo decoder with a frame size 60.
Figure 4:
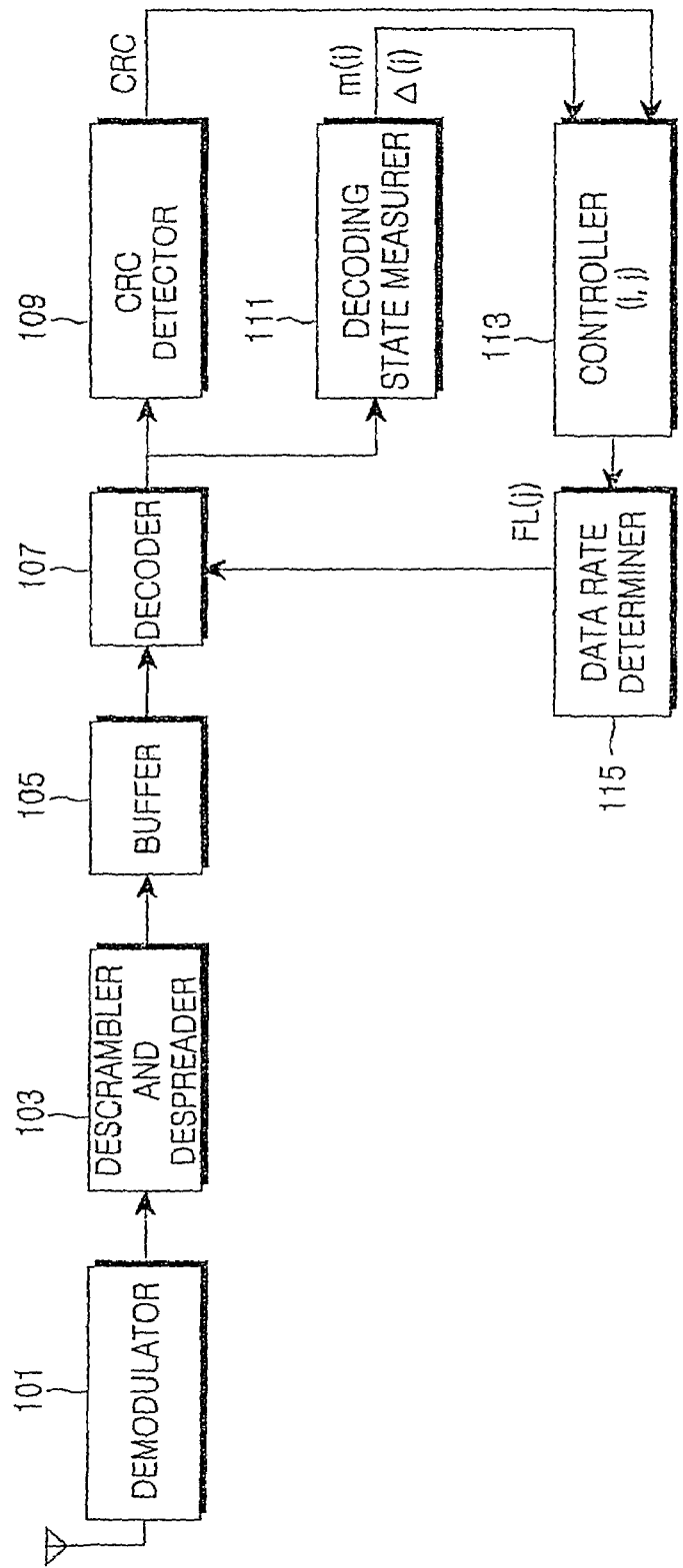
FIG. 4 illustrates a block diagram of a radio receiver for performing turbo decoding according to a preferred embodiment of the present invention.

FIG. 4 illustrates a block diagram of a radio receiver for performing turbo decoding according to a preferred embodiment of the present invention. A structure and operation of the radio receiver for performing the turbo decoding according to the present invention will be described in detail with reference to FIG. 4.

A radio signal transmitted from a transmitter is received at an antenna ANT of the receiver through a radio environment. A demodulator 101 then demodulates the radio signal. A signal output from the demodulator 101 is descrambled and despread by a descrambler and despreader 103. The output signal is provided to a buffer 105. The buffer 105 sequentially buffers the received signal according to the order of decoding and provides its output to a decoder 107.

The decoder 107, a turbo decoder according to the present invention, performs decoding according to a data rate (i.e., frame length) determined by a data rate determiner 115. The frame length of actual data transmitted and received in the mobile communication system becomes 39, 42, 49, 55, 58, 61, 65, 75 and 81 bits. For example, when the data rate determiner 115 desires to perform the decoding with a frame length of 39 bits, the turbo decoder 107 reads a data frame with a length of 39 bits from the buffer 105 and decodes the read data frame. The decoded data is provided to a CRC detector 109 and a decoding state measurer 111.

The CRC detector 109 performs hard decision and CRC checking on the output of the turbo decoder 107, and provides the CRC checking result to a controller 113. The decoding state measurer 111 measures decoding quality for the output of the turbo decoder 107, and provides the measured result to the controller 113. Based on the result values, the controller 113 manages a decoding iteration count value i, an iteration limit number, a data rate type count value j and the number N of the data rates, and detects a data rate transmitted from the transmitter. In addition, the controller 113 creates a signal to be provided to the data rate determiner 115 by receiving a value calculated by the decoding state measurer 111. The data rate determiner 115 determines the frame length associated with q data rate for the decoding based on a signal provided from the controller 113, and provides the determined frame length to the turbo decoder 107.

A control operation of the radio receiver having the above structure will be described with reference to FIGS. 5 to 8.

Figure 5:
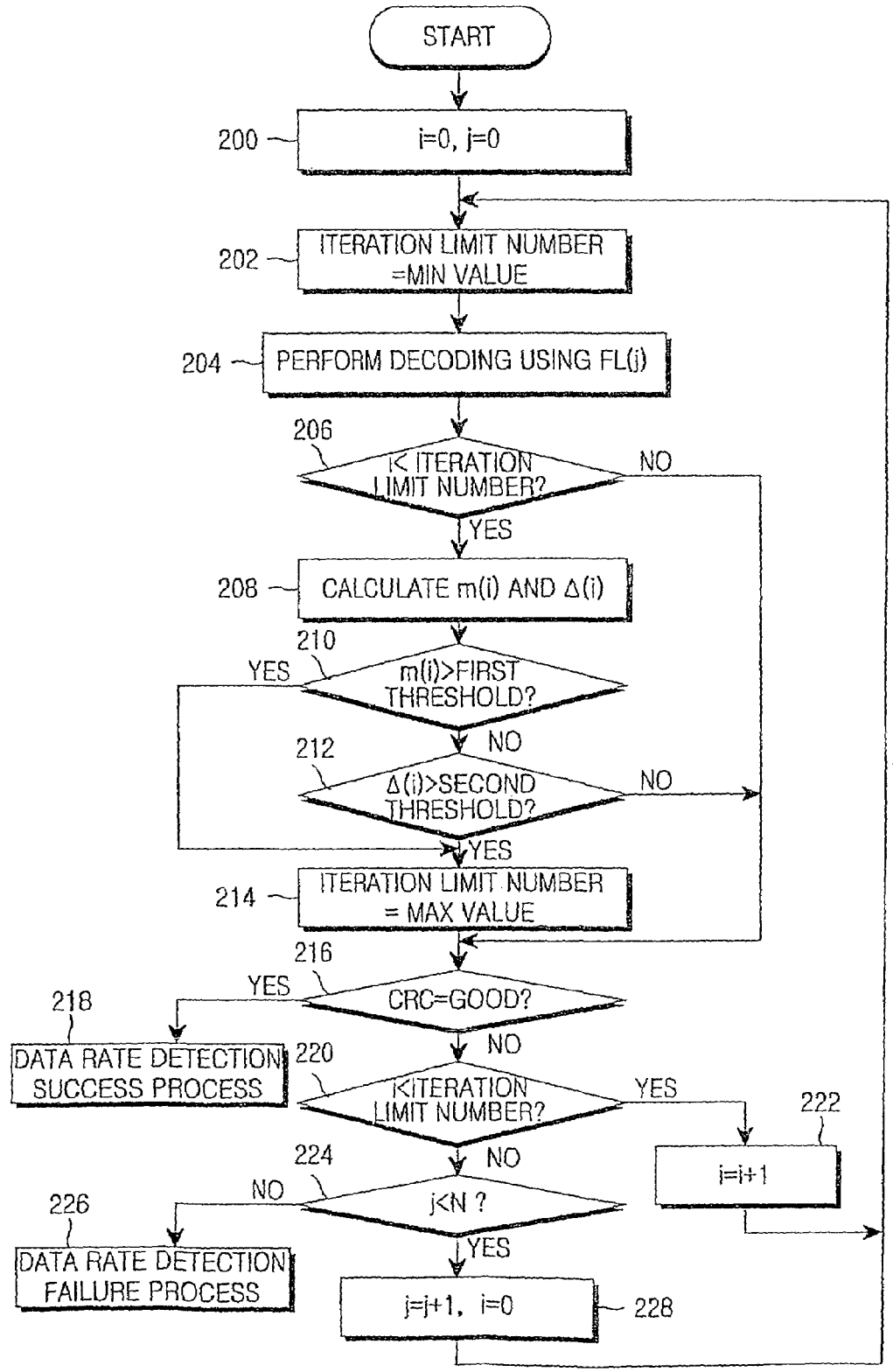
FIG. 5 illustrates a procedure for detecting a data rate in a BRD mode by a receiver performing turbo decoding according to a first embodiment of the present invention.

FIG. 5 illustrates a procedure for detecting a data rate in a BRD mode by a receiver performing turbo decoding according to a first embodiment of the present invention. A detailed description of a method for detecting a data rate using CRC checking of the BPD technique by the receiver will be described with reference to FIGS. 4 and 5.

In step 200, the controller 113 sets a decoding iteration count value i and a data rate type count value j to 0. For example, if the data frame with a length of 39, 42, 49, 55, 58, 61, 65, 75 and 81 bits can be transmitted through a radio channel, then the number N of the types of the data rates is 9 and the j value will be counted from 0 to 8. A data rate for decoding, i.e., the frame length is determined based on the j value. The frame length FL(j) associated with the data rate type count value j determined by the controller 113 is provided to the decoder 107 from the data rate determiner 115. In step 202, the controller 111 sets an iteration limit number to a predetermined minimum value. This is to perform the iterative decoding as minimum times as possible each time the data rate FL(j) is changed.

In step 204, the turbo decoder 107 decodes a data stream read from the buffer 105 using the FL(j) provided from the data rate determiner 115, and provides the decoded data to the CRC detector 109 and the decoding state measurer 111. The output of the turbo decoder 107 is a non-binary soft output value. The CRC detector 109 performs hard decision and CRC checking on the decoded data, and the decoding state measurer 111 measures a state (or quality) of the decoded data.

The controller 113 determines in step 206 whether the decoding iteration Count value i is less than the iteration limit number set in the step 202. As the result of the determination, if the decoding iteration count value i is less than the iteration limit number, the controller 113 proceeds to step 208, and otherwise proceeds to step 216.

In the step 208, the controller 113 calculates a decoding state value m(i) indicating quality of the currently decoded frame and an under-decoding state value Δ(i) defined as a difference between a decoding state value during current decoding and a decoding state value during previous decoding. The m(i) value is calculated by $$m(i) = \sum_{n=a}^{b} \frac{|llr_i(n)|}{b-(a-1)} = \frac{|llr_i(a)| + |llr_i(a+1)| + |llr_i(a+2)| \ldots |llr_i(b)|}{b-(a-1)} \quad (1)$$

In Equation (1), |•| represents an absolute value, and 'a' and 'b' represent given constants, where $0 \leq a < b < FL(j)$. Further, llr (Log Likelihood Ratio) becomes a non-binary soft output value decoded by the turbo decoder 107. That is, $llr_i(n)$ is an $n^{th}$ soft output value among FL(j) soft output values from the decoder 107 during $i^{th}$ iterative decoding for FL(j), i.e., a value required when it is converted to a binary value by hard decision. For example, if the llr value is a negative number, the hard decision result is '1', and if the llr value is a positive number, the hard decision result is '0'. The llr value is used for measuring decoding quality, because as its absolute value is higher, there is a high probability that the hard decision will be properly performed. That is, it can be considered that as the absolute value of the llr value is higher, the decoding quality is also higher. Here, the m(i) value can be an average (average of abs(llr)) of the absolute values of the FL(j) soft output values from the decoder 107. However, during an actual decoding operation, it is possible to obtain the similar result, even by using an average of the absolute values of some of the output values, i.e., $a^{th}$ to $b^{th}$ output values, among the FL(j) soft output values.

In addition, the under-decoding state value Δ(i) is calculated by $$\Delta(i) = m(i) - m(i-1) \quad (2)$$

In the formula, m(i) represents a decoding state value during the current decoding and m(i−1) represents a decoding state value during the previous decoding. As a result, it is noted that Δ(i) indicates how much the decoding quality is improved, by the iterative decoding at one data rate. Here, the Δ(i) is '0' during initial decoding.

Figure 6:
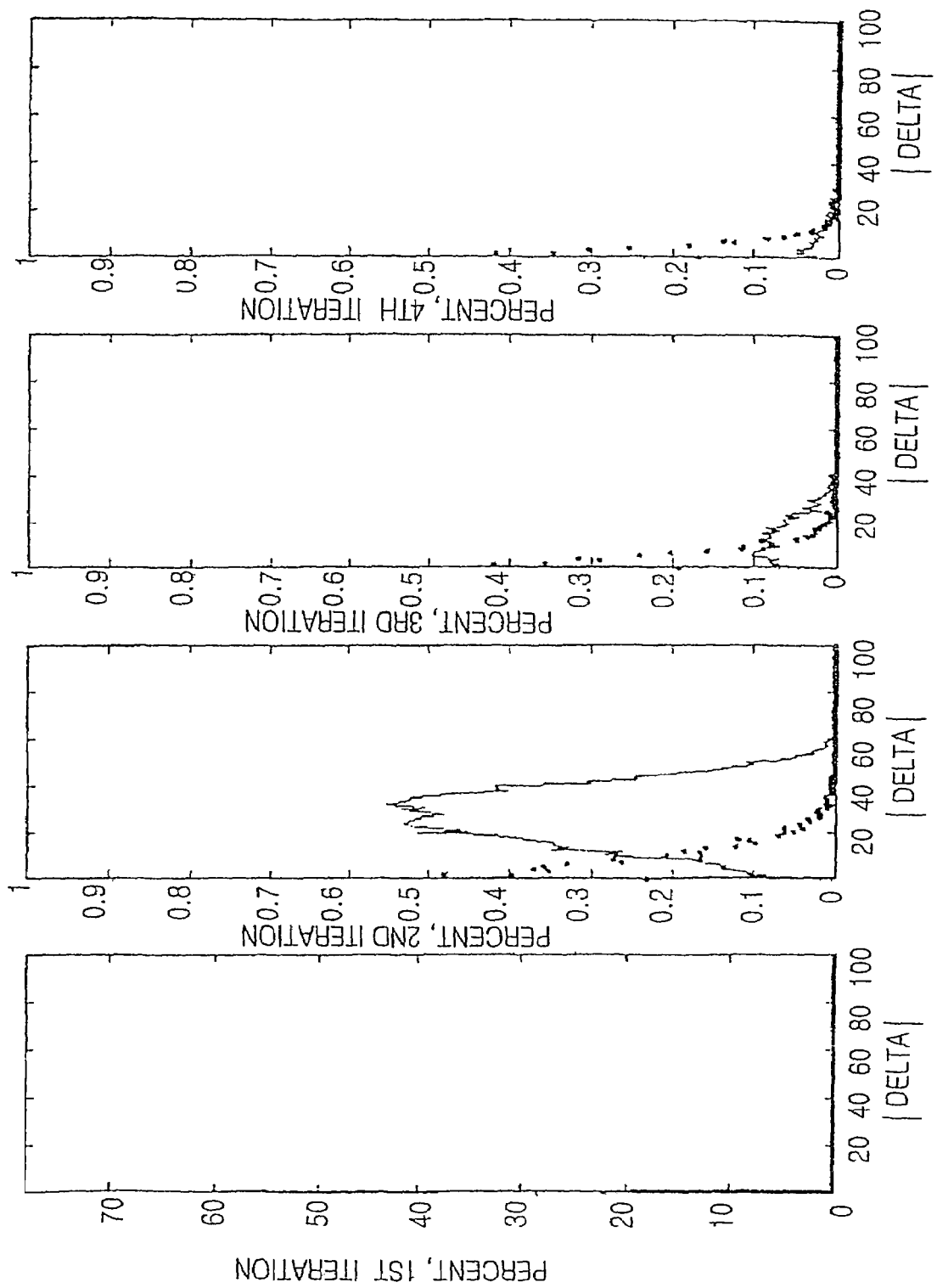
FIG. 6 illustrates a change in $\Delta(i)$ when rates are identical to each other.
Figure 7:
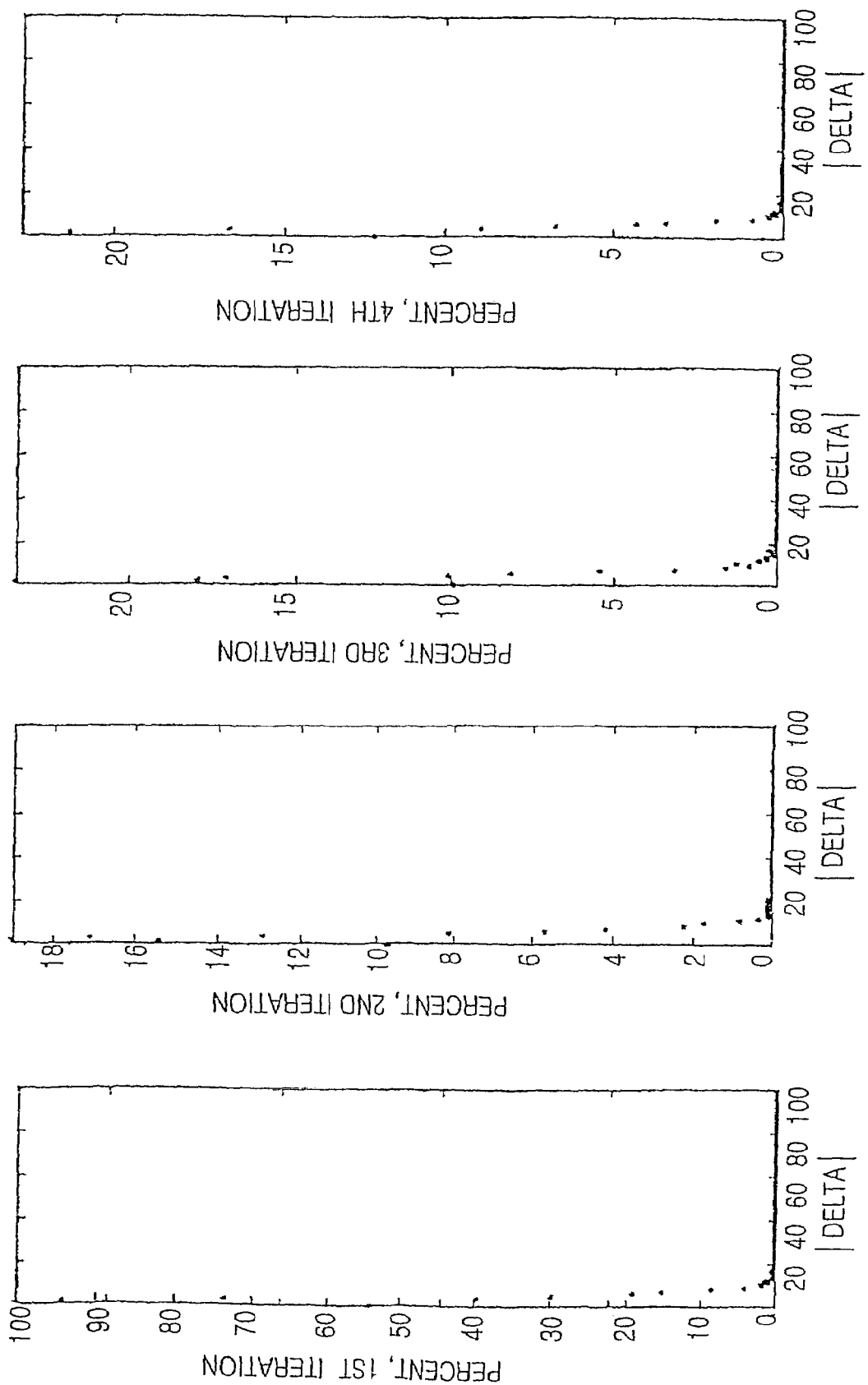
FIG. 7 illustrates a change in $\Delta(i)$ when rates are not identical to each other.

Based on Equation (2), FIG. 6 illustrates a change in the Δ(i) when an input frame length (an actual data rate to be used during transmission) is identical to a decoder frame length (a data rate used during the current decoding). It is noted herein that iteration of the decoding causes a change in the Δ(i). Further, FIG. 7 illustrates a change in the Δ(i) when the input frame length is not identical to the decoder frame length. It is noted herein that the Δ(i) is not changed even though the decoding is iterated. As illustrated, a change in the Δ(i) becomes a basis for determining whether a data rate is detected.

After calculating the m(i) value and the Δ(i) value based on Equations (1) and (2) in the step 208, the controller 113 determines in step 210 whether the m(i) value is larger than a first threshold. As the result of the determination, if the m(i)

value is larger than the first threshold, the controller 113 proceeds to step 214, and otherwise proceeds to step 212. Here, the first threshold can be set to the minimum value among the values having a high probability that the m(i) will be normally decoded. The controller 113 determines in step 212 whether the Δ(i) value is larger than a second threshold. Likewise, the second threshold can be set to the minimum value among the values having a high probability that the Δ(i) will be normally decoded. As the result of the determination, if the Δ(i) is larger than the second threshold, the controller 113 proceeds to step 214, and otherwise proceeds to step 216.

In the step 214, the controller 113 changes the iteration limit number to its maximum value, considering that it is necessary to iterate the decoding as many times as possible, and then proceeds to step 216.

In the step 216, the controller 113 determines whether the CRC checking result received from the CRC detector 109 is 'good'. If the CRC checking result is 'good', the controller 113 performs a data rate detection success process in step 218. That is, the controller 113 determines the data rate used during the decoding process of the step 204 as an actual data rate transmitted from the transmitter.

However, if the CRC checking result is not 'good', the controller 113 determines in step 220 whether the decoding iteration count value i is less than the iteration limit number. As the result of the determination, if the i value is less than the iteration limit number, the controller 113 increase the i value by 1 in step 222, and then returns to the step 202. However, if the i value is not less than the iteration limit number, i.e., if the turbo decoding has already been performed as many times as the set iteration limit number, the controller 113 determines in step 224 whether the data rate type count value j is less than the number N of the types of the frames. As the result of the determination, if the j value is less than the number of the types of the frames, the controller 113 increases the data rate type count value j by 1 and sets the decoding iteration count value i to 0 in step 228, and then returns to the step 202. However, if the j value is not less than the number N of the data rates, the controller 113 performs a data rate detection failure process in step 226.

Summarizing the above processes, when the count values i and j and the decoder frame size are determined, the decoder 107 performs decoding by first setting the iteration limit number to its minimum value. If one of the m(i) value and the Δ(i) value is larger than its associated threshold, the controller 113 increases the iteration limit number to its maximum value, considering that there is a high probability that the CRC checking result will be 'good' for the current frame size, and then attempts to detect a data rate by performing CRC checking on every decoding result after increasing the iteration limit number to its maximum value. If the CRC checking result is not 'good' even though the decoding is iterated as many times as the maximum iteration limit number, the controller 113 considers that the data rate used for the current decoding is not identical to a data rate used during the transmission. In the case where the data rate is selected in error, the probability that the m(i) value or the Δ(i) value will be larger than their associated thresholds, is almost close to 0. Thus, the decoding at the current data rate will be iterated as many times as the minimum iteration limit number.

If the m(i) value or the Δ(i) value are larger than their associated thresholds, it can be considered that there is a very high probability that the data rate will be detected even though the initial CRC checking result is not 'good'. Therefore, the decoding at the current data rate is iterated as many times as possible. As described above, the receiver according to the present invention reduces time and power required for detecting a data rate by iteratively decoding the data rate with the lower probability as many times as the minimum iteration limit number and iteratively decoding the data rate with the higher probability as many times as the maximum iteration limit number.

FIG. 8 illustrates a procedure for detecting a data rate in the BRD mode by a receiver performing turbo decoding according to a second embodiment of the present invention. A detailed description of the procedure for detecting a data rate according to the second embodiment of the present invention will be made with reference to FIGS. 4 and 8.

Steps 300 to 304 of FIG. 8 are equal in operation to the steps 200 to 204 of FIG. 5, so the description will be omitted for simplicity. The controller 113 determines in step 306 whether the decoding iteration count value i is less than the iteration limit number.

As the result of the determination, if the decoding iteration count value i is less than the iteration limit number, the decoding state measurer 111 calculates the m(i) and the Δ(i) using the data decoded by the decoder 107 in step 308. The m(i) and the Δ(i) are calculated based on Equations (1) and (2), respectively. After the calculation, the controller 113 determines in step 310 whether the decoding iteration count value i is equal to 0. If the decoding iteration count value i is equal to 0, the m(i) and the Δ(i) are not required, since the decoding is initial decoding. Therefore, in this case, the controller 113 proceeds to step 320. However, if the decoding iteration count value i is not 0, the controller 113 determines in step 312 whether the m(i) value is larger than a first threshold. In step 314, the controller 113 sets the iteration limit number to its maximum value and then proceeds to step 320. However, if the m(i) value is not larger than the first threshold, the controller 113 determines in step 316 whether the Δ(i) value larger than a second threshold. As the result of the determination, if the Δ(i) is larger than the second threshold, the controller 113 proceeds to step 318, and otherwise proceeds to step 324.

In the step 318, the controller 113 sets the iteration limit number to a predetermined intermediate value. Herein, for example, the minimum value can be set to 2 or 3, the intermediate value can be set to 5, and the maximum value can be set to 8. After setting the iteration limit number, the controller 113 determines whether a CRC state is 'good', by using CRC checking results received from the CRC detector 109. As the result of the determination, if the CRC state is 'good', the controller 113 performs a data rate detection success process in step 322. That is, the controller 113 determines the data rate used during the decoding of the step 304 as a data rate transmitted from the transmitter. However, if the CRC is not 'good', the controller 113 determines in step 324 whether the decoding iteration count value i is less than the iteration limit number.

As the result of the determination, if the decoding iteration count value i is less than the iteration limit number, the controller 113 increases the decoding iteration count value i by 1 in step 326, and then returns to the step 304. However, if the decoding iteration count value i is not less than the iteration limit number, the controller 113 determines in step 328 whether the data rate type count value j is less than the number N of the data rates. As the result of the determination, if the data rate type count value j is not less than the number N of the data rates, the controller 113 performs a data rate detection failure process in step 330. However, if the data rate type count value j is less than the number N of the data rates, the controller 113 increases the j value by 1 and sets the decoding iteration count value i to 0 in step 332, and then returns to the step 302.

In FIG. 8, unlike in FIG. 5, if the m(i) value is larger than the first threshold, the iteration limit number is set to its maximum value, and if the m(i) value is not larger than the first threshold and the Δ(i) value is larger than the second threshold, the iteration limit number is set to its intermediate value. That is, if there is a high probability that the data rate can be detected, the iteration limit number is set to its maximum value, and otherwise, the iteration limit number is set to its intermediate value, thereby making it possible to detect the data rate more rapidly.

In addition, in FIG. 8, unlike in FIG. 5, if the m(i) value is not larger than the first threshold and the Δ(i) value is not larger than the second threshold, the CRC checking is not performed. This is because it can be considered that there is a very low probability that the data rate will be detected, when both of the m(i) value and the Δ(i) value are not larger than their associated thresholds. Another reason is because the CRC checking result may become 'good' even though the input frame length is not identical to the decoder frame length due to serious damage of a received data frame. In this case, an incorrect data rate may be detected.

Shown in Table 1 are the iteration limit numbers based on the m(i) and the Δ(i) for the first embodiment of FIG. 5 and the second embodiment of FIG. 8.

TABLE 1

| m(i) > First Threshold | Yes | Yes | No | No |
|---|---|---|---|---|
| Δ(i) > Second Threshold | Yes | No | Yes | No |
| FIG. 5 | Maximum Value | Maximum Value | Maximum Value | Minimum Value |
| FIG. 8 | Maximum Value | Maximum Value | Intermediate Value | Minimum Value (No CRC) |

While the invention has been shown and described with reference to a certain preferred embodiment thereof, it will be understood by those skilled in the art that various changes in form and details may be made therein without departing from the spirit and scope of the invention as defined by the appended claims.

As described above, it is possible to rapidly detect a data rate by using the method for detecting the data rate in the BRD mode according to the present invention. In addition, the increase in detection speed of the data rate contributes to a reduction in power consumption, and a reduction in delay time enables rapid connection.

What is claimed is:

1. A method for decoding coded data in one frame transmitted from a transmitter at one data rate of a plurality of data rates by a turbo decoder of a receiver having no information on a data rate at which the coded data is transmitted, and detecting a data rate of the coded data, comprising the steps of:
   (a) decoding the coded data in the frame at a selected data rate of the plurality of the data rates by the turbo decoder and calculating a current decoding state value indicating an average of absolute values of log likelihood ratio (llr) values being identical to decoded values of the coded data, output from the turbo decoder;
   (b) calculating a current under-decoding state value defined as a difference between the current decoding state value and a previous decoding state value;
   (c) comparing the current decoding state value with a first threshold;
     (c-1) performing CRC (Cyclic Redundancy Check) checking on the decoded data if the current decoding state value is larger than a first threshold;
     (c-2) comparing the current under-decoding state value with a second threshold if the current decoding state value is not larger than a first threshold;
     (c-3) performing CRC checking on the decoded data if the current under-decoding state value is larger than a second threshold; and
   (d) determining the selected data rate as a data rate of the coded data transmitted from the transmitter, if the CRC checking result is good.

2. The method as claimed in claim 1, further comprising the step of (e) repeating the steps (a) to (d) within an iteration limit number until the selected data rate is determined as a data rate of the coded data, if the CRC checking result is not good.

3. The method as claimed in claim 2, further comprising the step of repeating the steps (a) to (e) until another selected data rate of the plurality of the data rates is determined as a data rate of the coded data, if a data rate of the coded data is not detected from the selected data rate.

4. The method as claimed in claim 3, wherein the iteration limit number is changed based on the current decoding state value and the current under-decoding state value during every decoding.

5. The method as claimed in claim 4, wherein the step (a) comprises the step of setting the iteration limit number to a predetermined minimum value.

6. The method as claimed in claim 5, wherein the iteration limit number is set to a predetermined maximum value, if the current decoding state value is larger than the first threshold.

7. The method as claimed in claim 5, wherein the iteration limit number is an intermediate value between the minimum value and the maximum value, if the current decoding state value is less than or equal to the first threshold and the current under-decoding state value is larger than the second threshold.

8. The method as claimed in claim 6 or 7, further comprising the step of returning to the step (a) without performing CRC checking on the decoded data, if the current decoding state value is less than or equal to the first threshold and the current under-decoding state value is less than or equal to the second threshold.

9. The method as claimed in any of claims 1 to 3, wherein the decoding state value is calculated by $$m = \frac{|llr(a)| + |llr(a+1)| + |llr(a+2)| \ldots |llr(b)|}{b - (a-1)}$$

where m represents the decoding state value, 'a' and 'b' represent constants, wherein $0 \leq a < b < FL$ where FL represents a frame length associated with the selected data rate, and llr(n) represents a soft output value of an $n^{th}$ bit from the turbo decoder for the FL.

10. An apparatus for decoding coded data in one frame transmitted from a transmitter at one data rate of a plurality of data rates by a turbo decoder of a receiver having no information on a data rate at which the coded data is transmitted, and detecting a data rate of the coded data, the apparatus comprising:
   a data rate determiner for selecting a data rate from a plurality of data rates;
   a turbo decoder for iteratively decoding an input data frame within an iteration limit number using the selected data rate, and outputting decoded data;
   a CRC detector for performing CRC checking on the decoded data and outputting a CRC checking result;

a decoding state measurer for measuring decoding quality using the decoded data and outputting decoding state information; and a controller for first determining the iteration limit number as a minimum value, controlling the iteration limit number based on the decoding state information, controlling the data rate determiner, and determining a data rate of the input data based on the CRC checking result;

wherein the decoding state information includes a current decoding state value indicating an average of absolute values of log likelihood ratio (llr) values being identical to soft output values of the decoded data, and also includes a current under-decoding state value defined as a difference between a current decoding state value and a previous decoding state value; and wherein the decoding state value is calculated by $$m = \frac{|llr(a)| + |llr(a+1)| + |llr(a+2)| \ldots |llr(b)|}{b-(a-1)}$$

where m represents the decoding state value, 'a' and 'b' represent constants, wherein $0 \leq a < b < FL$ where FL represents a frame length associated with the selected data rate, and llr(n) represents a soft output value of an $n^{th}$ bit from the turbo decoder for the FL.

11. An apparatus for decoding coded data in one frame transmitted from a transmitter at one data rate of a plurality of data rates by a turbo decoder of a receiver having no information on a data rate at which the coded data is transmitted, and detecting a data rate of the coded data, the apparatus comprising:

a data rate determiner for selecting a data rate from a plurality of data rates;

a turbo decoder for iteratively decoding an input data frame within an iteration limit number using the selected data rate, and outputting decoded data;

a CRC detector for performing CRC checking on the decoded data and outputting a CRC checking result;

a decoding state measurer for measuring decoding quality using the decoded data and outputting decoding state information; and a controller for first determining the iteration limit number as a minimum value, controlling the iteration limit number based on the decoding state information, controlling the data rate determiner, and determining a data rate of the input data based on the CRC checking result;

wherein the decoding state information includes a current decoding state value indicating an average of absolute values of log likelihood ratio (llr) values being identical to soft output values of the decoded data, and also includes a current under-decoding state value defined as a difference between a current decoding state value and a previous decoding state value; and wherein the controller sets the iteration limit number to a predetermined maximum value, if the current decoding state value is larger than a first threshold or the current under-decoding state value is larger than a second threshold.

12. An apparatus for decoding coded data in one frame transmitted from a transmitter at one data rate of a plurality of data rates by a turbo decoder of a receiver having no information on a data rate at which the coded data is transmitted, and detecting a data rate of the coded data, the apparatus comprising:

a data rate determiner for selecting a data rate from a plurality of data rates;

a turbo decoder for iteratively decoding an input data frame within an iteration limit number using the selected data rate, and outputting decoded data;

a CRC detector for performing CRC checking on the decoded data and outputting a CRC checking result;

a decoding state measurer for measuring decoding quality using the decoded data and outputting decoding state information; and a controller for first determining the iteration limit number as a minimum value, controlling the iteration limit number based on the decoding state information, controlling the data rate determiner, and determining a data rate of the input data based on the CRC checking result;

wherein the decoding state information includes a current decoding state value indicating an average of absolute values of log likelihood ratio (llr) values being identical to soft output values of the decoded data, and also includes a current under-decoding state value defined as a difference between a current decoding state value and a previous decoding state value; and wherein the controller sets the iteration limit number to a predetermined maximum value if the current decoding state value is larger than a first threshold and the current under-decoding state value is less than or equal to a second threshold.

13. The apparatus as claimed in claim 12, wherein the controller sets the iteration limit number to an intermediate value between the minimum value and the maximum value, if the current decoding state value is less than or equal to the first threshold and the current under-decoding state value is larger than the second threshold.

* * * * *

UNITED STATES PATENT AND TRADEMARK OFFICE
CERTIFICATE OF CORRECTION

PATENT NO. : 7,508,805 B2  Page 1 of 1
APPLICATION NO. : 10/398369
DATED : March 24, 2009
INVENTOR(S) : Soon-Jae Choi It is certified that error appears in the above-identified patent and that said Letters Patent is hereby corrected as shown below:

On the Title page of the patent, please insert the missing Foreign Application Priority Data:

--October 5, 2000   (KR) .................... 2000-58465--

Signed and Sealed this

Nineteenth Day of May, 2009

JOHN DOLL
*Acting Director of the United States Patent and Trademark Office*